United States Patent
Bae et al.

(10) Patent No.: US 10,477,741 B1
(45) Date of Patent: Nov. 12, 2019

(54) COMMUNICATION ENABLED EMF SHIELD ENCLOSURES

(71) Applicant: Apple Inc., Cupertino, CA (US)

(72) Inventors: Mun Soo Bae, Cupertino, CA (US);
Bing Jiang, Cupertino, CA (US);
Haejoon Jung, Cupertino, CA (US);
Indranil S. Sen, Cupertino, CA (US);
Mohit Narang, Cupertino, CA (US);
Ruben Caballero, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 154 days.

(21) Appl. No.: 15/019,607

(22) Filed: Feb. 9, 2016

Related U.S. Application Data

(60) Provisional application No. 62/234,504, filed on Sep. 29, 2015.

(51) Int. Cl.
*H05K 9/00* (2006.01)

(52) U.S. Cl.
CPC ................. *H05K 9/0049* (2013.01)

(58) Field of Classification Search
CPC . H05K 2201/0707; H05K 2201/10371; H05K 9/0024; H05K 9/0052; H05K 9/0071; H05K 9/0081; H05K 9/0049; H05K 9/0003
See application file for complete search history.

(56) References Cited

U.S. PATENT DOCUMENTS

| | | | |
|---|---|---|---|
| 3,502,809 A | 3/1970 | Dickey | |
| 4,785,136 A * | 11/1988 | Mollet | G06F 1/182 174/363 |
| 4,871,220 A * | 10/1989 | Kohin | G01J 5/08 250/515.1 |
| 5,373,102 A | 12/1994 | Ehrlich et al. | |
| 5,384,575 A * | 1/1995 | Wu | H01Q 15/0013 343/753 |
| 5,496,966 A * | 3/1996 | Hightower | H05K 9/0003 174/353 |

(Continued)

FOREIGN PATENT DOCUMENTS

| | | |
|---|---|---|
| CN | 101202277 | 6/2008 |
| CN | 104347259 | 2/2015 |

(Continued)

OTHER PUBLICATIONS

U.S. Appl. No. 15/422,345, filed Feb. 1, 2017, Qiu et al.
U.S. Appl. No. 15/474,569, filed Mar. 30, 2017, Jain et al.

*Primary Examiner* — Xanthia C Cunningham
(74) *Attorney, Agent, or Firm* — Brownstein Hyatt Farber Schreck, LLP

(57) ABSTRACT

An inductive power transmission system electromagnetic field shielding apparatus includes an enclosure. The enclosure is configured to surround an electronic device and an inductive power transmitter that inductively transmits power to the electronic device. A communication window or high pass filter is formed in the enclosure. The communication window may include an arrangement of one or more conductive materials defining one or more apertures. The enclosure and the communication window block passage of magnetic flux generated by the inductive power transmitter. The communication window allows passage of communication transmissions associated with the electronic device.

20 Claims, 9 Drawing Sheets

(56) References Cited

U.S. PATENT DOCUMENTS

| | | | |
|---|---|---|---|
| 5,545,844 A * | 8/1996 | Plummer, III | H05K 9/0043 174/363 |
| 5,563,614 A * | 10/1996 | Alden | H01Q 1/248 343/701 |
| 5,760,584 A * | 6/1998 | Frederick | G01R 33/422 324/318 |
| 6,144,512 A * | 11/2000 | Eden | G02B 5/204 359/350 |
| 6,269,247 B1 * | 7/2001 | Chiodini | H01Q 15/0006 455/446 |
| 6,449,181 B1 | 9/2002 | Rieger et al. | |
| 6,492,587 B1 * | 12/2002 | Yoshinaga | H01J 11/10 174/350 |
| 6,768,051 B2 * | 7/2004 | Wiltshire | H05K 9/0075 174/391 |
| 6,864,419 B2 | 3/2005 | Lovens | |
| 6,927,574 B2 * | 8/2005 | Young | G01R 33/32 174/353 |
| 7,035,087 B2 * | 4/2006 | Tan | G06F 1/181 174/359 |
| 7,068,140 B2 | 6/2006 | Chou | |
| 7,170,363 B2 * | 1/2007 | Wiltshire | H01P 3/12 174/353 |
| 7,639,206 B2 * | 12/2009 | Behdad | H01Q 1/286 333/202 |
| 7,679,205 B1 | 3/2010 | Burns | |
| 7,791,311 B2 | 9/2010 | Sagoo | |
| 7,906,936 B2 | 3/2011 | Azancot et al. | |
| 7,948,208 B2 | 5/2011 | Partovi et al. | |
| 7,948,781 B2 | 5/2011 | Esaka et al. | |
| 7,952,322 B2 | 5/2011 | Partovi et al. | |
| 8,013,568 B2 | 9/2011 | Park et al. | |
| 8,050,063 B2 | 11/2011 | Wagoner et al. | |
| 8,101,931 B2 * | 1/2012 | Blandford, III | H01J 65/044 174/357 |
| 8,115,448 B2 | 2/2012 | John | |
| 8,169,185 B2 | 5/2012 | Partovi et al. | |
| 8,193,769 B2 | 6/2012 | Azancot et al. | |
| 8,262,244 B2 | 9/2012 | Metcalf | |
| 8,338,990 B2 | 12/2012 | Baarman et al. | |
| 8,421,274 B2 | 4/2013 | Sun et al. | |
| 8,436,317 B1 | 5/2013 | Chen | |
| 8,531,153 B2 | 9/2013 | Baarman et al. | |
| 8,587,154 B2 | 11/2013 | Fells et al. | |
| 8,629,652 B2 | 1/2014 | Partovi et al. | |
| 8,629,654 B2 | 1/2014 | Partovi et al. | |
| 8,723,053 B2 * | 5/2014 | Winch | H05K 9/0043 174/359 |
| 8,729,734 B2 | 5/2014 | Widmer et al. | |
| 8,760,113 B2 | 6/2014 | Keating et al. | |
| 8,779,745 B2 | 7/2014 | Brown | |
| 8,810,196 B2 | 8/2014 | Ettes et al. | |
| 8,836,276 B2 | 9/2014 | Prescott | |
| 8,890,470 B2 | 11/2014 | Partovi | |
| 8,896,264 B2 | 11/2014 | Partovi | |
| 8,901,881 B2 | 12/2014 | Partovi | |
| 8,928,284 B2 | 1/2015 | Carobolante | |
| 8,947,047 B2 | 2/2015 | Partovi et al. | |
| 8,947,892 B1 * | 2/2015 | Lam | H05K 9/0086 174/357 |
| 9,001,031 B2 | 4/2015 | Lo et al. | |
| 9,024,576 B2 | 5/2015 | Maenpaa | |
| 9,041,152 B2 | 5/2015 | Luo et al. | |
| 9,071,062 B2 | 6/2015 | Whitehead | |
| 9,106,083 B2 | 8/2015 | Partovi | |
| 9,112,362 B2 | 8/2015 | Partovi | |
| 9,112,363 B2 | 8/2015 | Partovi | |
| 9,112,364 B2 | 8/2015 | Partovi | |
| 9,118,203 B2 | 8/2015 | Davis | |
| 9,124,126 B2 | 9/2015 | Ichikawa | |
| 9,153,998 B2 | 10/2015 | Mayo | |
| 9,171,555 B2 * | 10/2015 | Meloche | G11B 5/1278 |
| 9,177,716 B2 | 11/2015 | Goto | |
| 9,178,369 B2 | 11/2015 | Partovi | |
| 9,209,627 B2 | 12/2015 | Baarman et al. | |
| 9,217,323 B2 | 12/2015 | Clark | |
| 9,276,437 B2 | 3/2016 | Partovi et al. | |
| 9,281,759 B2 | 3/2016 | Lee et al. | |
| 9,300,147 B2 | 3/2016 | Lee et al. | |
| 9,356,659 B2 | 5/2016 | Partovi | |
| 9,497,894 B1 * | 11/2016 | Ramsey | H05K 9/0005 |
| 9,548,158 B2 | 1/2017 | Groves et al. | |
| 9,577,460 B2 | 2/2017 | Park | |
| 9,711,272 B2 | 7/2017 | Hassan-Ali et al. | |
| 9,726,518 B2 | 8/2017 | Widmer et al. | |
| 9,748,326 B2 | 8/2017 | Yen et al. | |
| 9,831,686 B2 | 11/2017 | Kohara et al. | |
| 9,905,360 B2 | 2/2018 | Muntean et al. | |
| 9,917,479 B2 | 3/2018 | Bronson et al. | |
| 10,090,709 B2 | 10/2018 | Matsumoto et al. | |
| 10,141,785 B2 | 11/2018 | Son et al. | |
| 10,270,293 B2 | 4/2019 | Lenive | |
| 10,277,442 B2 | 4/2019 | Kim et al. | |
| 2002/0009251 A1 * | 1/2002 | Byrne | G02F 1/0316 385/2 |
| 2002/0137473 A1 * | 9/2002 | Jenkins | H01Q 1/245 455/575.5 |
| 2004/0021376 A1 | 2/2004 | Beulich | |
| 2005/0156525 A1 * | 7/2005 | Joo | C03C 17/38 313/587 |
| 2007/0231587 A1 * | 10/2007 | Naito | H01J 11/10 428/457 |
| 2008/0047747 A1 * | 2/2008 | Aoyama | H05K 9/0096 174/389 |
| 2008/0067914 A1 * | 3/2008 | Kim | H01J 9/205 313/493 |
| 2009/0001980 A1 * | 1/2009 | Geren | B82Y 25/00 324/252 |
| 2009/0052721 A1 | 2/2009 | Dabrowski | |
| 2010/0015918 A1 | 1/2010 | Liu et al. | |
| 2011/0050164 A1 | 3/2011 | Partovi et al. | |
| 2011/0164471 A1 | 7/2011 | Baarman | |
| 2011/0169770 A1 * | 7/2011 | Mishina | G06F 1/1656 345/174 |
| 2011/0221385 A1 | 9/2011 | Partovi et al. | |
| 2012/0104997 A1 | 5/2012 | Carobolante | |
| 2012/0120395 A1 * | 5/2012 | Hahn | G01J 3/0286 356/326 |
| 2012/0139358 A1 | 6/2012 | Teggatz et al. | |
| 2012/0178364 A1 * | 7/2012 | Dobyns | H04M 1/7253 455/41.1 |
| 2012/0198364 A1 * | 8/2012 | Bornheimer | G06F 8/77 715/762 |
| 2013/0043734 A1 | 2/2013 | Stone et al. | |
| 2013/0093388 A1 | 4/2013 | Partovi | |
| 2013/0099563 A1 | 4/2013 | Partovi et al. | |
| 2013/0260677 A1 | 10/2013 | Partovi | |
| 2013/0271069 A1 | 10/2013 | Partovi | |
| 2013/0285604 A1 | 10/2013 | Partovi | |
| 2013/0285605 A1 | 10/2013 | Partovi | |
| 2013/0300204 A1 | 11/2013 | Partovi | |
| 2014/0035383 A1 | 2/2014 | Riehl | |
| 2014/0103873 A1 | 4/2014 | Partovi et al. | |
| 2014/0132210 A1 | 5/2014 | Partovi | |
| 2014/0191568 A1 | 7/2014 | Partovi | |
| 2014/0306654 A1 | 10/2014 | Partovi | |
| 2014/0354279 A1 | 12/2014 | Dumoulin | |
| 2015/0043424 A1 * | 2/2015 | Mitchell | H01Q 1/243 370/328 |
| 2015/0130412 A1 | 5/2015 | Partovi | |
| 2015/0288193 A1 | 10/2015 | Crosby et al. | |
| 2015/0303707 A1 | 10/2015 | McCauley et al. | |
| 2015/0318710 A1 | 11/2015 | Lee et al. | |
| 2015/0333530 A1 | 11/2015 | Moyer et al. | |
| 2015/0333562 A1 | 11/2015 | Nam et al. | |
| 2016/0064137 A1 | 3/2016 | Perez et al. | |
| 2016/0172894 A1 | 6/2016 | Khripkov et al. | |
| 2016/0181853 A1 | 6/2016 | Yang et al. | |
| 2016/0196943 A1 * | 7/2016 | Jarrahi | H01H 49/00 335/105 |
| 2016/0284465 A1 | 9/2016 | Maniktala | |
| 2016/0372948 A1 * | 12/2016 | Kvols | H02J 7/0042 |

(56) References Cited

U.S. PATENT DOCUMENTS

| | | |
|---|---|---|
| 2017/0092409 A1 | 3/2017 | Graham |
| 2017/0093199 A1 | 3/2017 | Pinciuc et al. |
| 2017/0279305 A1 | 9/2017 | Staring et al. |
| 2017/0353046 A1 | 12/2017 | Chen et al. |
| 2018/0062442 A1 | 3/2018 | Qiu et al. |
| 2018/0198318 A1 | 7/2018 | Jain et al. |

FOREIGN PATENT DOCUMENTS

| | | |
|---|---|---|
| EP | 2211438 | 7/2010 |
| EP | 2256895 | 12/2010 |
| JP | 5510608 | 6/2014 |
| KR | 20080081480 | 9/2008 |
| WO | WO2008/032746 | 3/2008 |
| WO | WO 09/081126 | 7/2009 |

\* cited by examiner

COMMUNICATION ENABLED EMF SHIELD ENCLOSURES

CROSS-REFERENCE TO RELATED APPLICATION

This application claims the benefit under 35 U.S.C. § 119(e) to U.S. Provisional Patent Application No. 62/234,504, filed on Sep. 29, 2015, and entitled "Communication Enabled EMF Shield Enclosures," the entirety of which is incorporated by reference as if fully disclosed herein.

FIELD

The described embodiments relate generally to electromagnetic field shielding. More particularly, the present embodiments relate to an enclosure for an inductive power transmission system that blocks passage of the inductive electromagnetic field while allowing passage of communication transmissions.

BACKGROUND

Electronic devices utilize power from one or more power sources to perform a variety of different functions. In order to be portable, electronic devices may include one or more batteries that function as the power source. Batteries typically store a limited amount of power and are generally either recharged or discarded when the batteries no longer store sufficient power for use.

In some cases, a battery of an electronic device may be charged by connecting the battery or electronic device to a wired power connection. For example, a wired power connection may include a power cable that connects the battery or electronic device to a wall outlet.

In other cases, the battery may be charged via a wireless power transmission system, such as an inductive power transmission system. In an inductive power transmission system, alternating current is run through a transmit coil. This causes the transmit coil to generate magnetic flux. A voltage may be induced in a receive coil that is positioned within the magnetic flux. Thus, power may be inductively transmitted from the transmit coil to the receive coil.

However, the magnetic flux generated by the transmit coil may interact with nearby objects other than the receive coil. This may interfere with such objects and/or may reduce the efficiency of the inductive power transmission.

SUMMARY

The present disclosure relates to enclosures that block or attenuate frequencies below a threshold while allowing frequencies at or above the threshold to pass through. The enclosure may be an inductive power transmission system electromagnetic field shielding apparatus that is operable to inductively transmit power to an enclosed electronic device in order to charge a battery of the electronic device. The inductive power transmission system electromagnetic field shielding apparatus may include an enclosure having a communication window or high pass filter formed therein. The communication window may be formed of conductive materials that define apertures. The dimensions of the apertures may determine frequencies that the grid blocks or attenuates and which frequencies the grid allows to pass through. The grid may be configured to block or attenuate frequencies corresponding to the inductive power transmissions while allowing frequencies corresponding to communication transmissions associated with the electronic device to pass through.

In various embodiments, an inductive power transmission system electromagnetic field shielding apparatus includes an enclosure and a communication window formed in the enclosure. The enclosure is configured to surround an electronic device and an inductive power transmitter (which may be incorporated into the enclosure) that inductively transmits power to the electronic device. The enclosure and the communication window block passage of magnetic flux generated by the inductive power transmitter. The communication window allows passage of communication transmissions associated with the electronic device.

In some examples, the communication window is a mesh. In various examples, the communication window is a grid of conductive materials that define apertures.

In numerous examples, the communication window blocks frequencies below approximately 700 megahertz and allows passage of frequencies equal to or above approximately 700 megahertz. This may be due, at least in part, to distances between conductive materials of the communication window.

In some embodiments, an electromagnetic field shielding apparatus includes connected walls and a grid including conductive material formed in at least one of the connected walls. The grid blocks passage of frequencies below a threshold and allows passage of frequencies equal to or above the threshold. The electromagnetic field shielding apparatus is operable to transition between a first configuration and a second configuration. The electromagnetic field shielding apparatus is operable to at least partially enclose an electronic device in the first configuration. The electromagnetic field shielding apparatus defines an opening in the second configuration though which the electronic device can be inserted into the electromagnetic field shielding apparatus or removed from the electromagnetic field shielding apparatus.

In various examples, the at least one of the connected walls in which the grid is formed includes a nonconductive material and the conductive material of the grid is positioned on or within the nonconductive material. In some examples, the grid is formed in all of the connected walls.

In some examples, a dimension of the conductive material of the grid is dynamically configurable. In such examples, increasing the dimension of the conductive material of the grid increases the threshold and decreasing the dimension of the conductive material of the grid decreases the threshold.

In various examples, the frequencies below the threshold include a frequency of a magnetic flux used in inductively transmitting power to the electronic device. In some examples, the frequencies equal to or above the threshold include a frequency utilized by a communication component of the electronic device.

In numerous embodiments, an enclosure includes metal walls configured to at least partially surround an electronic device and a high pass filter formed by apertures defined by edges in the metal walls. The high pass filter attenuates electromagnetic frequencies below a threshold. The threshold corresponds to distances between the edges of the metal walls across the apertures.

In some examples, a frequency utilized to inductively transmit power to the electronic device is below the threshold. In various examples, a frequency utilized by the electronic device in a communication transmission is above the threshold. The communication transmission may include at least one of a cellular communication transmission, a WiFi communication transmission, or a Bluetooth communication transmission.

In various examples, at least a portion of the metal walls corresponding to the high pass filter is a mesh. In some examples, the metal walls are a nonferrous metal.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The description that follows includes sample systems, methods, and apparatuses that embody various elements of the present disclosure. However, it should be understood that the described disclosure may be practiced in a variety of forms in addition to those described herein.

The following disclosure relates to an electromagnetic field (EMF) shielding apparatus. The apparatus includes an enclosure with a communication window formed therein that functions as a high pass filter by blocking or attenuating EMF below a threshold frequency and allowing passage of EMF equaling or exceeding the threshold frequency. For example, the communication window may be a grid formed of conductive materials that define apertures where the dimensions of the apertures determine the threshold frequency. The EMF shielding apparatus may be an inductive power transmission system EMF shielding apparatus that is operable to inductively transmit power to charge the battery of an electronic device. In such an implementation, the frequency of the inductive power transmission may be below the threshold frequency whereas one or more frequencies utilized by one or more communication components of the electronic device may be equal to or exceed the threshold. In this way, the EMF shielding apparatus may block or attenuate EMF from the inductive power transmission while allowing communication transmissions to pass through.

These and other embodiments are discussed below with reference to FIGS. 1A-6. However, those skilled in the art will readily appreciate that the detailed description given herein with respect to these Figures is for explanatory purposes only and should not be construed as limiting.

Figure 1A:
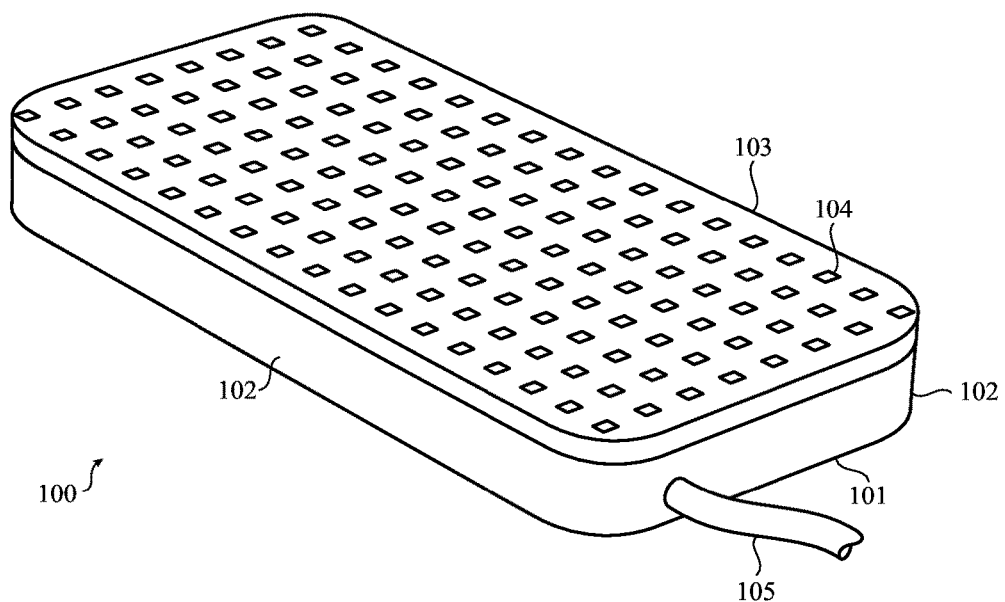
FIG. 1A depicts an inductive power transmission system including an electromagnetic field shielding apparatus enclosure.

FIG. 1A depicts an inductive power transmission system 100 including an electromagnetic field shielding apparatus enclosure 101 that may be operable to at least partially enclose or surround an electronic device. The electromagnetic field shielding apparatus enclosure 101 may be operable to inductively transmit power from a power source such as a power cord 105 to the electronic device, which may charge one or more batteries of the electronic device. A communication window 103 of the electromagnetic field shielding apparatus enclosure 101 may function as a high pass filter that blocks or attenuates frequencies below a threshold. The frequency of the inductive power transmission may be below the threshold while frequencies of communication transmissions to and/or from the electronic device may meet or exceed the threshold.

In this way, the electromagnetic field shielding apparatus enclosure 101 may shield the EMF of the inductive power transmission while allowing communication transmissions to pass through. Shielding the EMF of the inductive power transmission may prevent interference or interaction of the EMF with nearby objects, which may allow the electromagnetic field shielding apparatus enclosure 101 to be safer, meet various regulations regarding EMF transmissions, and/ or ensure efficiency of the inductive power transmission.

The electromagnetic field shielding apparatus enclosure 101 may include connected walls. The walls may be formed of conductive material, such as a nonferrous metal like aluminum. Forming the walls of nonferrous metal may block and/or attenuate some EMF frequencies without interfering with inductive power transmission. As shown, the connected walls may include side walls 102 that are connected to each other and to a top wall that is the communication window 103. The communication window 103 may be a grid formed of conductive material that defines apertures 104 or holes. The frequency threshold of frequencies that are blocked or attenuated and those that are allowed to pass through may be determined by one or more dimensions of the apertures 104, the number of apertures 104, and/or the position of the apertures 104.

Figure 1B:
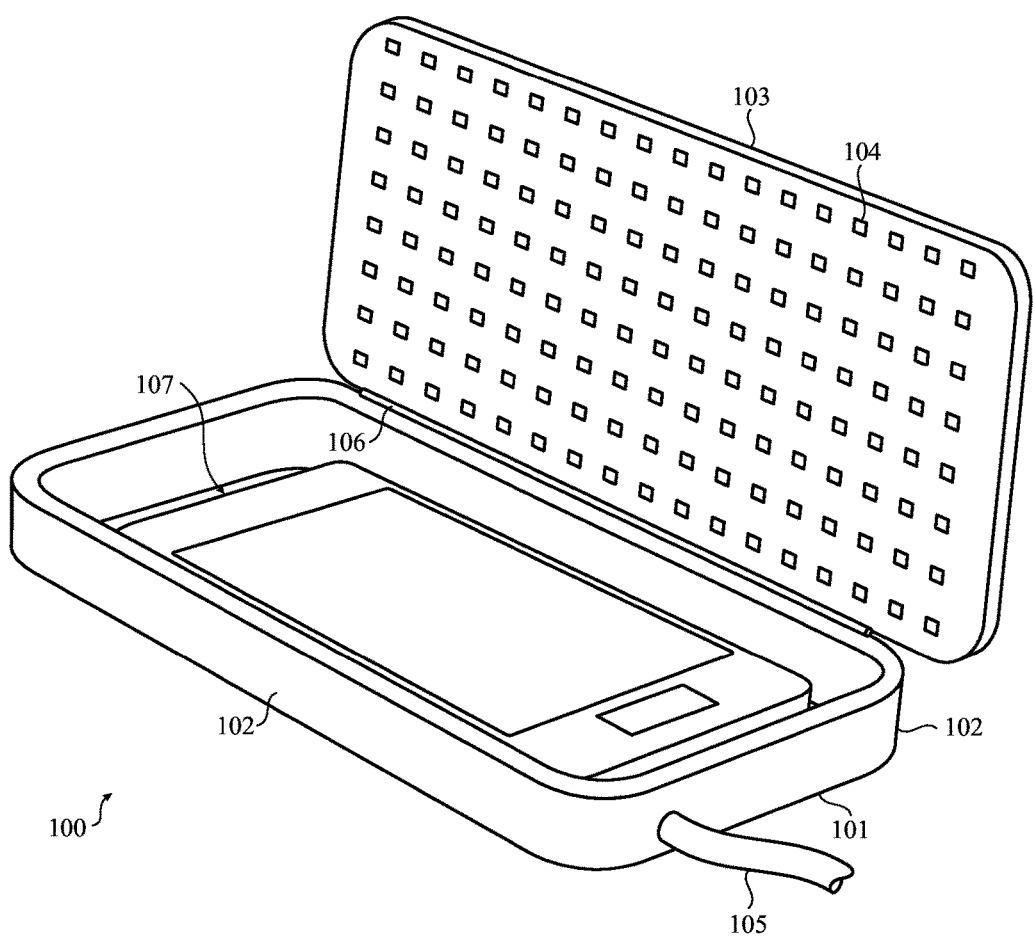
FIG. 1B depicts the inductive power transmission system of FIG. 1A with the top wall of the electromagnetic field shielding apparatus enclosure in an open configuration.

The electromagnetic field shielding apparatus enclosure 101 may be operable to transition between at least a first configuration and a second configuration. For example, FIG. 1A illustrates a closed configuration where the electromagnetic field shielding apparatus enclosure 101 may be operable to at least partially enclose or surround an electronic device. FIG. 1B illustrates a second configuration, or an open configuration, where the communication window 103 is open.

With reference to FIGS. 1A and 1B, the communication window 103 may be moveably coupled to the side walls 102 by a hinge 106. The hinge 106 may allow movement of the communication window 103 such that the electromagnetic field shielding apparatus enclosure 101 may transitioned between opened (FIG. 1B) and closed (FIG. 1A). When open, the electronic device 107 may be inserted into the electromagnetic field shielding apparatus enclosure 101 (through an opening defined by the communication window 103 and the side walls 102 as shown) and/or removed therefrom. When closed, the electromagnetic field shielding apparatus enclosure 101 may at least partially enclose or surround the electronic device 107.

Figure 1C:
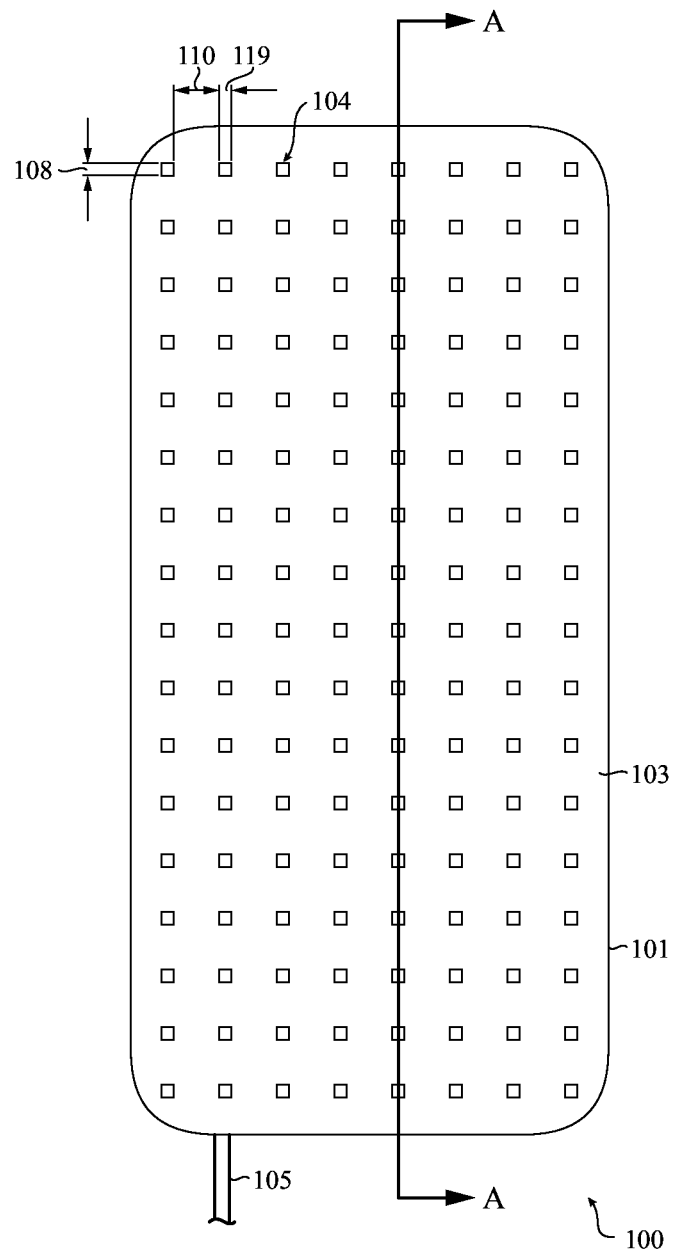
FIG. 1C depicts a top view of the inductive power transmission system of FIG. 1A.

FIG. 1C depicts a top view of the inductive power transmission system 100 of FIG. 1A. The communication window 103 is configured as a grid, mesh, or screen formed of conductive material with apertures 104 or holes defined therein. The apertures 104 have a length 108 and width 109. The length 108 and width 109 of the apertures 104 correspond to the distance between edges in the conductive material of the communication window 103. The apertures 104 also have a distance 110 between the apertures 104. The distance 110 between the apertures corresponds to the dimension of the conductive material of the communication window 103 between apertures. These dimensions of the apertures 104 and the conductive material of the communication window 103 (the length 108, width 109, and distance 110), as well as the number of the apertures 104, may determine the frequency threshold at which electromagnetic radiation is blocked and/or attenuated and/or allowed to pass, relating to the proportion of conductive material to air and/or nonconductive material. This may be due to the relationship between the wavelength of the frequencies and the dimensions of the apertures 104 and the conductive material of the communication window 103 (the length 108, width 109, and distance 110).

For example, the communication window 103 may be configured to block and/or attenuate frequencies below approximately 700 MHz and pass frequencies above or equal to approximately 700 MHz. Inductive power transmission may operate at 433 MHz whereas cellular communication signals may be in various ranges between approximately 700-900 MHz, WiFi communication signals may be in a 2 GHz or 5 GHz range, and Bluetooth communication signals may be in a 5 GHz range. Thus, in this example, the communication window 103 blocks and/or attenuates the inductive power transmission as it has a frequency below the frequency threshold and allows the various communication signals to pass as they exceed the frequency threshold.

Although a particular number of apertures 104 of particular shapes arranged in a particular configuration are shown, it is understood that this is an example. In various implementations, various numbers of apertures 104 of various shapes (such as circles, triangles, rectangles, stars, ovals, irregular shapes, and so on) may be arranged in various configurations. The shapes and/or arrangement of the apertures 104 may influence the frequency threshold in addition to the dimensions of the apertures 104 and/or the number of the apertures 104.

Figure 1D:
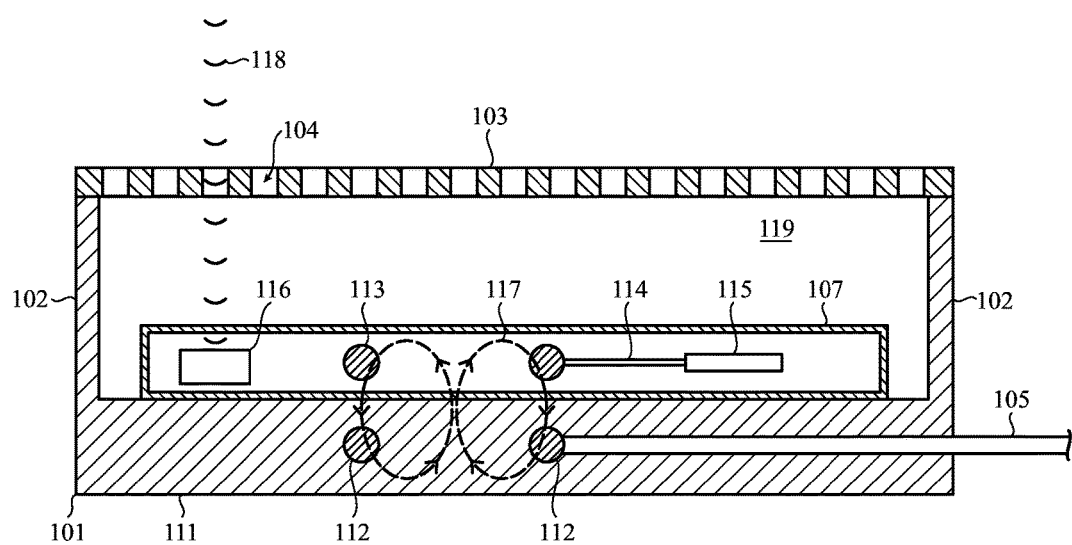
FIG. 1D depicts a simplified schematic cross sectional view of the inductive power transmission system of FIG. 1C, taken alone line A-A of FIG. 1C.

FIG. 1D depicts a simplified schematic cross sectional view of the inductive power transmission system 100 of FIG. 1C, taken alone line A-A of FIG. 1C. As shown, the electromagnetic field shielding apparatus enclosure 101 may include a bottom wall 111 that connects to the side walls 102 to define a cavity 119 along with the top wall of the communication window 103. The electronic device 107 (such as a smart phone, wearable device, tablet computing device, mobile computing device, and/or any other electronic device) may be positioned in the cavity 119.

An inductive transmitter coil 112 may be incorporated into the bottom wall 111 (though in other examples the inductive transmitter coil 112 may be disposed in the cavity 119 in other ways). Alternating power from the power cord 105 may be run through the inductive transmitter coil 112. This may generate magnetic flux 117. An inductive receiver coil 113 of the electronic device 107 may be positioned within the magnetic flux 117. This may generate a voltage in the inductive receiver coil 113. Thus, power may be inductively transmitted from the inductive transmitter coil 112 to the inductive receiver coil 113. This inductively transmitted power may be used to charge one more batteries 115 of the electronic device 107 via a wire 114 or other electrical path.

The electronic device 107 may include one or more communication components 116 that are operable to receive and/or transmit one or more wireless communication signals 118. Such communication signals 118 may include cellular signals, WiFi signals, Bluetooth signals, and so on.

The communication window 103 may block or attenuate the magnetic flux 117 while allowing passage of the communication signals 118. This may be because the magnetic flux 117 has a frequency below the frequency threshold of the communication window whereas the frequency of the communication signals 118 meets or exceeds the communication threshold. In this way, the electronic device 107 may continue to transmit and/or receive communications while being inductively charged without exposing nearby objects to the magnetic flux 117.

Figure 2:
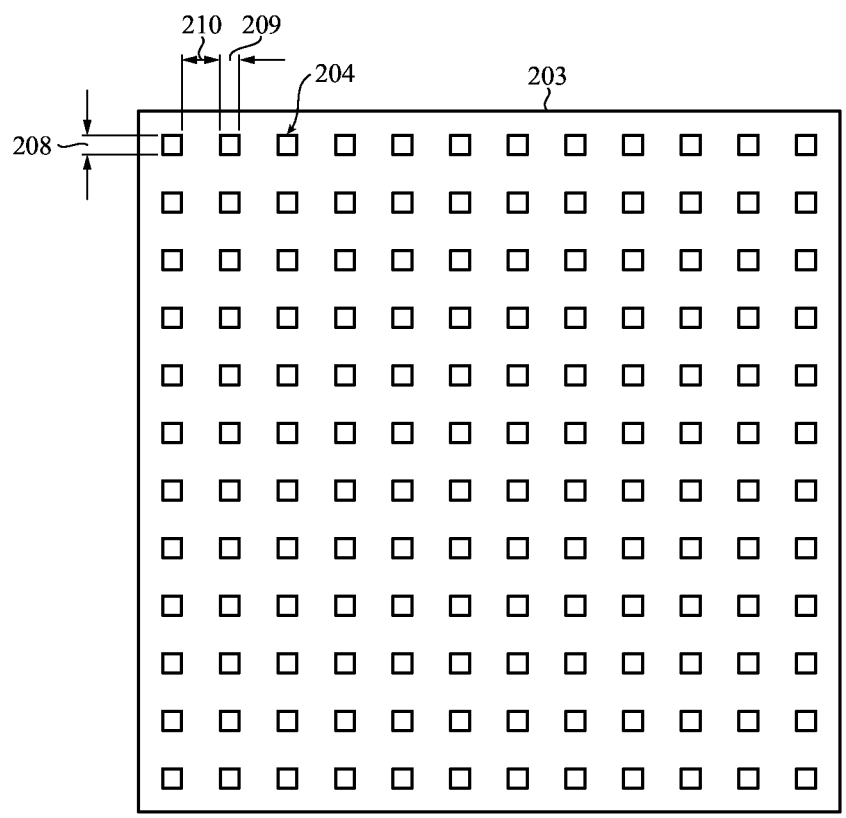
FIG. 2 depicts a close-up top view of a first alternative example top wall that may be used in an electromagnetic field shielding apparatus enclosure in accordance with further embodiments.

FIG. 2 depicts a close-up top view of a first alternative example top wall that may be used in an electromagnetic field shielding apparatus enclosure in accordance with further embodiments. As illustrated, the communication window 203 or high pass filter or may be formed of conductive material having apertures 204 or holes having lengths 208 and widths 209 that are 50 millimeters apart in a distance 210. In other words, there is a 50 millimeter distance 210 of conductive material between the apertures 204. The communication window 203 may be used in in an electromagnetic field shielding apparatus enclosure that inductively transmits power to an electronic device at 433 MHz where the electronic device includes a communication unit that uses a communication signal frequency of 5.75 GHz. If removal of the communication window 203 to expose the electronic device is assigned a reference 0 dB (such as the open position illustrated in FIG. 1B), use of the communication window 203 (such as in the closed position shown in FIG. 1A) may result in −27.27 dB (negative values indicating the amount of path loss due to the communication window 203) for the 433 MHz inductive power transmission and −4.53 dB for the 5.75 GHz communication signal.

Thus, the communication window 203 may partially block or attenuate both the 433 MHz inductive power transmission and the 5.75 GHz communication signal. However, the communication window 203 may block or attenuate the 433 MHz inductive power transmission significantly more than the 5.75 GHz communication signal. This may allow the electronic device to still communicate while the inductive power transmission is blocked or attenuated from nearby objects.

Figure 3:
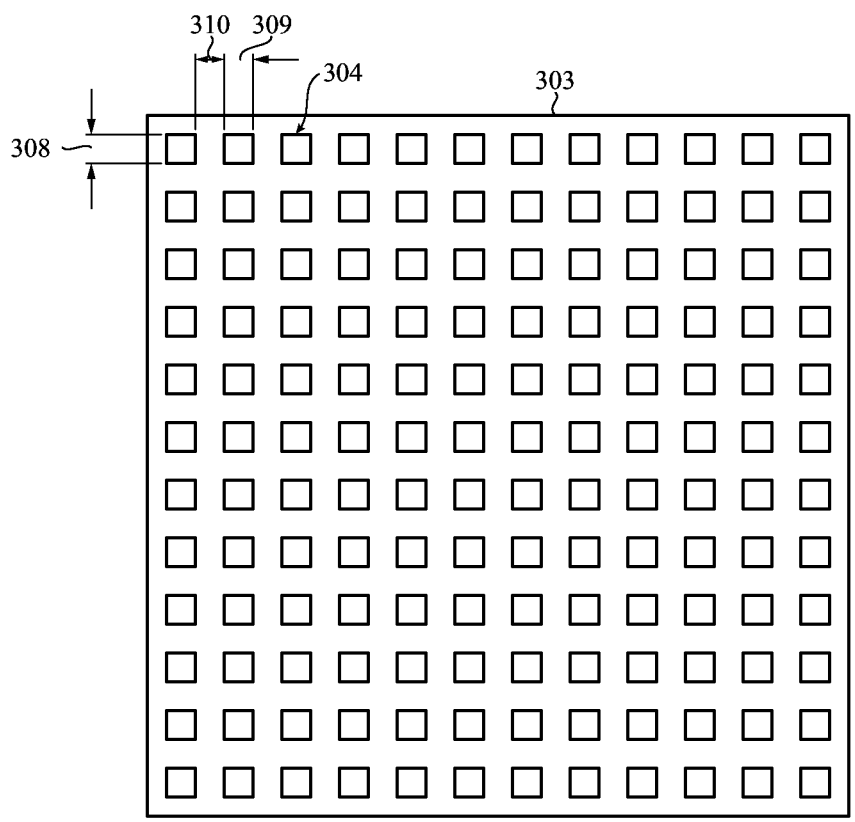
FIG. 3 depicts a close-up top view of a second alternative example top wall that may be used in an electromagnetic field shielding apparatus enclosure in accordance with further embodiments.

FIG. 3 depicts a close-up top view of a second alternative example top wall that may be used in an electromagnetic field shielding apparatus enclosure in accordance with further embodiments. As illustrated, the communication window 303 or high pass filter may be formed of conductive material having apertures 304 or holes having lengths 308 and widths 309 that are 30 millimeters apart in a distance 310. Compared to the communication window 203 of FIG. 2, the communication window 303 of FIG. 3 may result in −18.24 dB for the 433 MHz inductive power transmission and 1.24 dB for the 5.75 GHz communication signal. Thus, the communication window 303 blocks or attenuate the 433 MHz inductive power transmission without blocking or attenuating (and may amplify) the 5.75 GHz communication signal. Though the communication window 303 of FIG. 3 may not block or attenuate the 433 MHz inductive power transmission as much as the communication window 203 of FIG. 2, more of the 5.75 GHz communication signal is allowed to pass.

Figure 4:
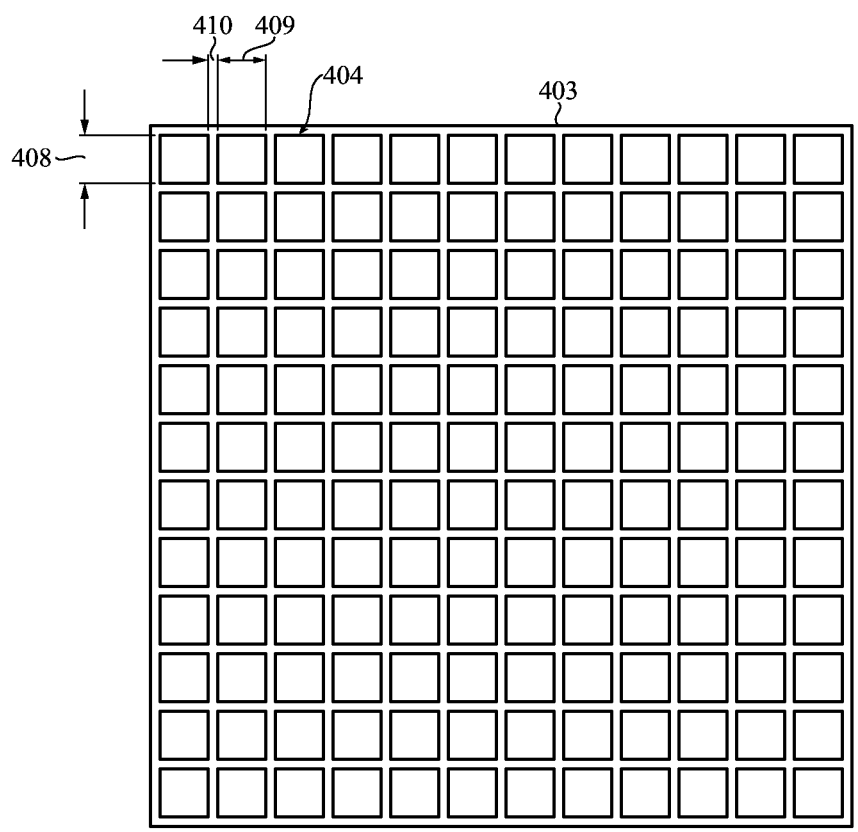
FIG. 4 depicts a close-up top view of a third alternative example top wall that may be used in an electromagnetic field shielding apparatus enclosure in accordance with further embodiments.

FIG. 4 depicts a close-up top view of a third alternative example top wall that may be used in an electromagnetic field shielding apparatus enclosure in accordance with further embodiments. As illustrated, the communication window 403 or high pass filter may be formed of conductive material having apertures 404 or holes having lengths 408 and widths 409 that are 20 millimeters apart in a distance 410. Compared to the communication window 203 of FIG. 2 and the communication window 303 of FIG. 3, the communication window 403 of FIG. 4 may result in −14.98 dB for the 433 MHz inductive power transmission and 1.60 dB for the 5.75 GHz communication signal. Though the communication window 403 of FIG. 4 may not block or attenuate the 433 MHz inductive power transmission as much as the communication window 203 of FIG. 2 or the communication window 303 of FIG. 3, more of the 5.75 GHz communication signal is allowed to pass.

Figure 5:
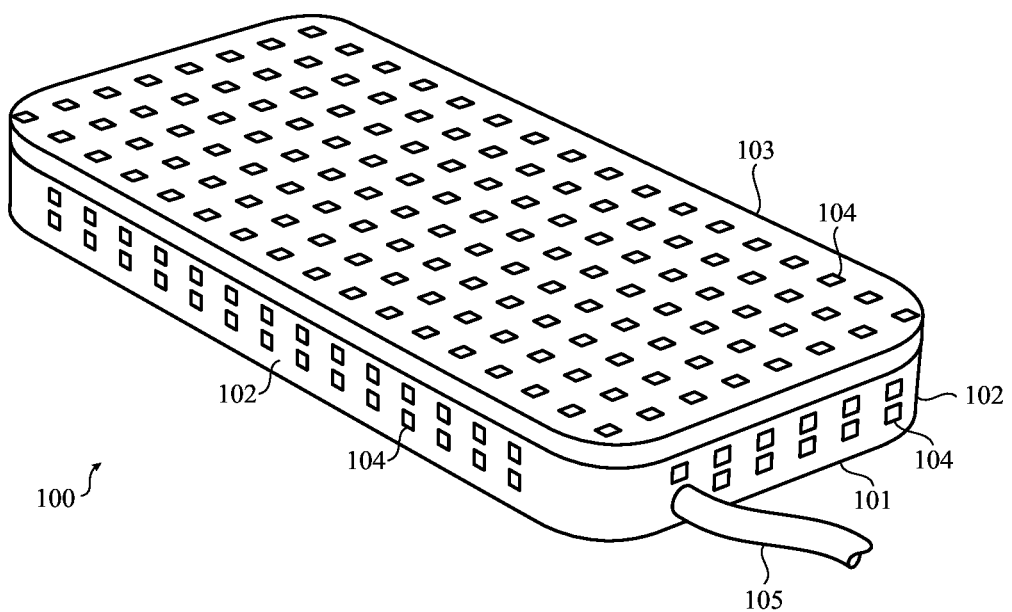
FIG. 5 depicts an alternative inductive power transmission system including an alternative electromagnetic field shielding apparatus enclosure in accordance with further embodiments.

FIG. 5 depicts an alternative inductive power transmission system 500 including an alternative electromagnetic field shielding apparatus enclosure 501 in accordance with further embodiments.

Returning to FIGS. 1A-1D, although a particularly configured electromagnetic field shielding apparatus enclosure 101 is illustrated and described, it is understood that this is an example. In various implementations, enclosures may be otherwise configured without departing from the scope of the present disclosure.

For example, the electromagnetic field shielding apparatus enclosure 101 is illustrated and described as having a communication window 103 as a top wall formed of a conductive material with apertures 104 or holes defined therein (such as by drilling, lasering, machining, and/or otherwise removing portions of the conductive material to form the apertures 104). However, in various implementations, the apertures 104 may be filled. In some examples of such implementations, the apertures 104 may be filled with a nonconductive material such as polymer resin.

Alternatively, rather than apertures 104 defined in a conductive material, a communication window 103 may be formed of a nonconductive material. Such a nonconductive material may not define actual holes. Instead, various structures (such as strips or wires) of conductive material may be disposed on or in portions of the nonconductive material (such as by coating, overlaying, embedding, and so on) where the apertures 104 correspond to portions of the nonconductive material where conductive material is not present. For example, areas of a resin wall may be doped with conductive material where non-doped areas correspond to the apertures 104. By way of another example, areas of a clear resin wall may be coated with a clear or translucent conductive material such as indium tin oxide where non-coated areas correspond to the apertures 104.

Further, the electromagnetic field shielding apparatus enclosure 101 is illustrated and described as having a communication window 103 with conductive materials and apertures 104 of fixed dimensions. However, in various examples, one or more dimensions of the conductive materials forming the communication window 103 (and thus one or more dimensions of the apertures 104) may be dynamically configurable. In such an implementation, increasing the dimension of the conductive material of the grid of the communication window 103 may increase the frequency threshold. Conversely, decreasing the dimension of the conductive material of the grid of the communication window 103 may decrease the frequency threshold.

For example, the communication window 103 may be formed of a crisscrossed pattern of nitinol (nickel titanium) wires or other structures that expand when current is passed through them. In such an example, the apertures 104 may be gaps between the nitinol wires. The electromagnetic field shielding apparatus enclosure 101 may include a processing unit or other controller that is operable to selectively pass current through the nitinol wires, dynamically altering the frequency threshold of which frequencies are attenuated and/or blocked by the communication window 103 and which are allowed to pass.

When the electromagnetic field shielding apparatus enclosure 101 is inductively transmitting power, the processing unit may pass current through the nitinol wires. This may cause the nitinol wires to expand, increasing one or more dimensions of the nitinol wires and decreasing one or more dimensions of the apertures 104 (and thus increasing the frequency threshold). This may cause more of the communication signals 118 to be blocked and/or attenuated, but may block and/or attenuate and acceptable amount while maximizing blocking and/or attenuating the inductive power transmission. When the electromagnetic field shielding apparatus enclosure 101 is no longer inductively transmitting power, the processing unit may cease passing current through the nitinol wires. This may cause the nitinol wires to contract, decreasing one or more dimensions of the nitinol wires and increasing one or more dimensions of the apertures 104 (and thus decreasing the frequency threshold). This may allow more of the communication signals to pass. This may also block and/or attenuate the inductive power transmission less if such were present. However, as the electromagnetic field shielding apparatus enclosure 101 is not inductively transmitting power, there may be no inductive power transmission to block and thus more communication signals may be safely allowed to pass.

Additionally, although the communication window 103 is illustrated and described as a top wall of the electromagnetic field shielding apparatus enclosure 101, it is understood that this is an example. In various implementations, the communication window 103 may be formed at a portion of the electromagnetic field shielding apparatus enclosure 101 that corresponds to a location of a communication component of the electronic device 107. By locating the communication window 103 proximate to a communication component of the electronic device 107, inductive power transmissions may be more effectively blocked while allowing for communication signals to pass as the communication window 103 may be able to have smaller dimensions than would otherwise be possible.

Figure 6:
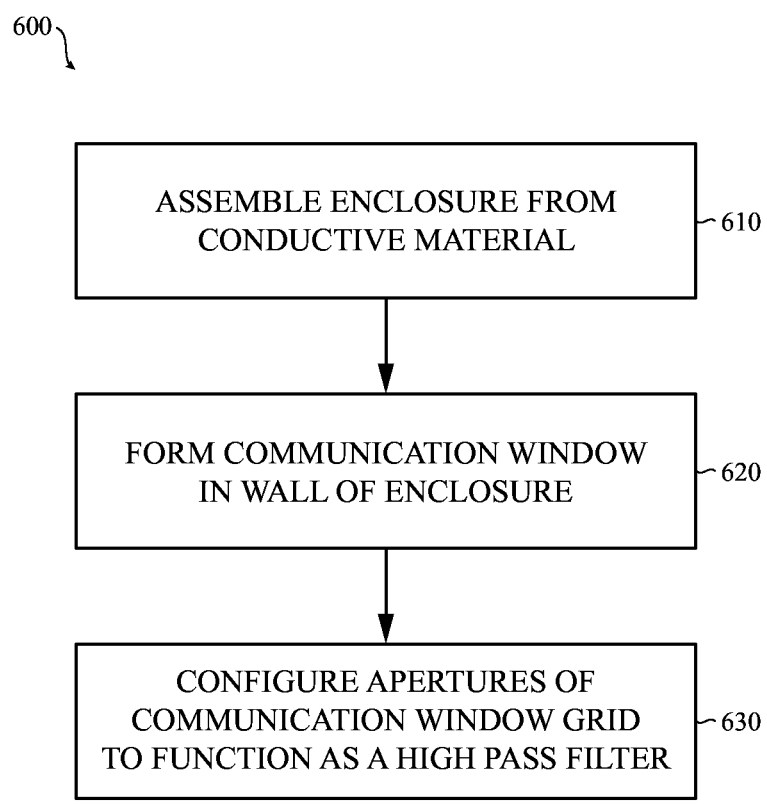
FIG. 6 depicts a flow chart illustrating a method for constructing a communication enabled EMF shield enclosure. This method may construct one or more of the enclosures of FIGS. 1A-5.

FIG. 6 depicts a flow chart illustrating a method 600 for constructing a communication enabled EMF shield enclosure (also encompassing as an inductive power transmission system or other electromagnetic shielding apparatus, enclosure, and so on). This method may construct one or more of the enclosures of FIGS. 1A-5.

At 610, an enclosure is assembled from conductive materials. The enclosure may include a number of connected walls. The conductive materials may include a metal such as aluminum; a resin (such as a polymer or plastic) or other nonconductive material doped with conductive material, coated with conductive material, and/or with conductive material otherwise embedded therein.

At 620, a communication window may be formed in one or more of the walls of the enclosure. The communication window may be a formed as a grid of conductive material (such as of the conductive material of the wall by drilling or otherwise removing portions of the conductive material to form apertures). Such a grid may be a mesh, screen, and/or other structure.

At 630, apertures of the communication window grid to function as a high pass filter. Configuring the apertures may include configuring one or more dimensions of the apertures, the number of the apertures, the arrangement of the apertures, the shape of the apertures, the dimension of the conductive materials of the grid between the apertures, and so on. Configuring the apertures such that the communication window grid functions as a high pass filter may include configuring the communication window grid to block and/or attenuate EMF below a threshold frequency and pass EMF equal to or above the threshold frequency, and/or block and/or attenuate EMF equal to or above the threshold frequency less than EMF below the threshold frequency.

Although the example method 600 is illustrated and described as including particular operations performed in a particular order, it is understood that this is an example. In various implementations, various orders of the same, similar, and/or different operations may be performed without departing from the scope of the present disclosure.

For example, 610-630 are illustrated and described as separate, linearly performed operations. However, it is understood that this is an example. In various implementations, apertures of the communication window grid may be configured while the communication grid is being formed in one or more of the walls. This may be performed before the walls are connected to form the enclosure.

As described above and illustrated in the accompanying figures, the present disclosure relates to an EMF shielding apparatus. The apparatus includes an enclosure with a communication window formed therein that functions as a high pass filter by blocking or attenuating EMF below a threshold frequency and allowing passage of EMF equaling or exceeding the threshold frequency. For example, the communication window may be a grid formed of conductive materials that define apertures where the dimensions of the apertures determine the threshold frequency. The EMF shielding apparatus may be an inductive power transmission system EMF shielding apparatus that is operable to inductively transmit power to charge the battery of an electronic device. In such an implementation, the frequency of the inductive power transmission may be below the threshold frequency whereas one or more frequencies utilized by one or more communication components of the electronic device may be equal to or exceed the threshold. In this way, the EMF shielding apparatus may block or attenuate EMF from the inductive power transmission while allowing communication transmissions to pass through.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An inductive power transmission system electromagnetic field shielding apparatus, comprising:
    an enclosure configured to surround an electronic device and an inductive power transmitter that inductively transmits power to the electronic device; and
    a communication window formed in the enclosure; wherein:
    the enclosure and the communication window block passage of magnetic flux generated by the inductive power transmitter; and
    the communication window allows passage of communication transmissions associated with the electronic device.

2. The inductive power transmission system electromagnetic field shielding apparatus of claim 1, wherein the communication window comprises a mesh.

3. The inductive power transmission system electromagnetic field shielding apparatus of claim 1, wherein the communication window comprises a grid of conductive materials that define apertures.

4. The inductive power transmission system electromagnetic field shielding apparatus of claim 1, wherein the communication window blocks frequencies below approximately 700 megahertz.

5. The inductive power transmission system electromagnetic field shielding apparatus of claim 4, wherein the communication window allows passage of frequencies equal to or above approximately 700 megahertz.

6. The inductive power transmission system electromagnetic field shielding apparatus of claim 5, wherein the communication window blocks the frequencies below approximately 700 megahertz and allows passage of the frequencies equal to or above approximately 700 megahertz due to distances between conductive materials of the communication window.

7. The inductive power transmission system electromagnetic field shielding apparatus of claim 1, wherein the inductive power transmitter is incorporated into the enclosure.

8. An electromagnetic field shielding apparatus, comprising:
connected walls; and
a grid including conductive material formed in at least one of the connected walls that blocks passage of frequencies below a threshold and allows passage of frequencies equal to or above the threshold; wherein:
magnetic flux produced by an inductive power transmitter has a first frequency below the threshold and is blocked;
a communication transmission transmitted or received by a communication component has a second frequency equal to or above the threshold and is allowed;
the electromagnetic field shielding apparatus is operable to transition between a first configuration and a second configuration;
the electromagnetic field shielding apparatus is operable to at least partially enclose an electronic device in the first configuration; and
the electromagnetic field shielding apparatus defines an opening in the second configuration though which the electronic device can be inserted into the electromagnetic field shielding apparatus or removed from the electromagnetic field shielding apparatus.

9. The electromagnetic field shielding apparatus of claim 8, wherein the at least one of the connected walls in which the grid is formed comprises a nonconductive material and the conductive material of the grid is positioned on or within the nonconductive material.

10. The electromagnetic field shielding apparatus of claim 8, wherein a dimension of the conductive material of the grid is dynamically configurable.

11. The electromagnetic field shielding apparatus of claim 10, wherein:

increasing the dimension of the conductive material of the grid increases the threshold; and
decreasing the dimension of the conductive material of the grid decreases the threshold.

12. The electromagnetic field shielding apparatus of claim 8, wherein the grid is formed in all of the connected walls.

13. The electromagnetic field shielding apparatus of claim 8, wherein the magnetic flux is produced by the inductive power transmitter transmitting power to the electronic device.

14. The electromagnetic field shielding apparatus of claim 8, wherein the electronic device includes the communication component.

15. An enclosure, comprising:
metal walls configured to at least partially surround an electronic device; and
a high pass filter formed by apertures defined by edges in the metal walls; wherein
the high pass filter attenuates electromagnetic frequencies below a threshold to block passage of magnetic flux produced by an inductive power component and allow communication transmissions transmitted or received by a communication component; and
the threshold corresponds to distances between the edges of the metal walls across the apertures.

16. The enclosure of claim 15, wherein a frequency utilized to inductively transmit power to the electronic device is below the threshold.

17. The enclosure of claim 15, wherein a frequency utilized by the electronic device in a communication transmission is above the threshold.

18. The enclosure of claim 17, wherein the communication transmission comprises at least one of:
a cellular communication transmission;
a WiFi communication transmission; or
a Bluetooth communication transmission.

19. The enclosure of claim 15, wherein at least a portion of the metal walls corresponding to the high pass filter comprises a mesh.

20. The enclosure of claim 15, wherein the metal walls comprise a nonferrous metal.

* * * * *